United States Patent [19]

Luckett et al.

[11] Patent Number: 4,879,680
[45] Date of Patent: Nov. 7, 1989

[54] MULTI-SLAVE MASTER-SLAVE FLIP-FLOP

[75] Inventors: Dirk R. Luckett, Dallas, Tex.; James P. Parkerson, Portland, Me.

[73] Assignee: Texas Instruments Incorporated, Dallas, Tex.

[21] Appl. No.: 789,285

[22] Filed: Oct. 18, 1985

[51] Int. Cl.$^4$ .................. G11C 7/00; G11C 19/00; G11C 19/28

[52] U.S. Cl. .................. 365/154; 365/189.03; 365/78; 307/272.2

[58] Field of Search ............. 307/221, 272 A; 365/73, 365/75, 78, 154, 189

[56] References Cited

U.S. PATENT DOCUMENTS

| | | | |
|---|---|---|---|
| 3,493,785 | 2/1970 | Rapp | 365/154 X |
| 3,573,754 | 4/1971 | Merryman | 365/154 X |
| 3,742,466 | 6/1973 | Hamm et al. | 365/75 X |
| 3,940,749 | 2/1976 | Cicognani et al. | 365/73 X |
| 4,024,512 | 5/1977 | Amelio et al. | 365/73 X |
| 4,101,973 | 7/1978 | Tromp | 365/73 |
| 4,128,879 | 12/1978 | Gardner | 365/73 |
| 4,156,819 | 5/1979 | Takahashi et al. | 307/272 A |
| 4,222,102 | 9/1980 | Jansen et al. | 365/73 X |
| 4,276,488 | 6/1981 | Benedict | 307/272 A |
| 4,359,647 | 11/1982 | Trinkl | 307/272 A X |
| 4,627,030 | 12/1986 | Barber | 365/230 X |
| 4,665,509 | 5/1987 | Ooami et al. | 365/233 |
| 4,694,431 | 9/1987 | Miyamura et al. | 365/189 |

FOREIGN PATENT DOCUMENTS 2037519  7/1980  United Kingdom ........... 307/272 A

Primary Examiner—Stuart N. Hecker
Assistant Examiner—Alyssa H. Bowler
Attorney, Agent, or Firm—Rene' E. Grossman; Melvin Sharp

[57] ABSTRACT

A master-slave flip-flop has multiple slave cells (S1,S2,S3 . . . ) coupled to a single master cell (MASTER). The slave cell to be written to or read is accessed by select signals (WRITE and READ SELECT) coupled to the slave cells. This provides a savings in chip area of approximately the area taken up by the missing master cells which would normally correspond to the extra slave cells (S2,S3, . . . ). A Schottky transistor logic implementation can provide for a multi-port computer register file by including multiple READ SELECT signals for each master and associated set of slaves, and an output multiplexer coupled to the outputs of pairs of master-slave sets.

4 Claims, 3 Drawing Sheets

MULTI-SLAVE MASTER-SLAVE FLIP-FLOP

BACKGROUND AND SUMMARY OF THE INVENTION

The present invention relates generally to electronic logic circuits, and more specifically to a master-slave flip-flop.

Master-slave flip-flops are commonly used in the design of integrated circuits. They are reliable, stable and their state changes are predictable. However, a penalty in terms of surface area on an integrated circuit chip must be paid because each data bit to be stored in a flip-flop requires two parts, a master and a slave. When many bits are to be stored, such as in a register file memory for a microcomputer system, a fairly large space penalty is paid when master-slave flip-flops are used.

It would be desirable to provide circuitry for storing multiple logic bits without paying the surface area penalty extracted by multiple master-slave flip-flops.

Therefore, it is an object of the present invention to provide circuitry suitable for use in a computer system which provides the benefits of master-slave flip-flop storage without the usual space penalty.

Therefore, in accordance with an aspect of the present invention, a single flipflop master cell drives multiple flip-flop slave cells. The slave cells are separately addressable. A savings in chip surface area is thus realized. The multi-slave flip-flop can be integrated onto a CPU or other computer system chip.

In accordance with another preferred embodiment, twenty-two slave flip-flop cells are grouped together into two groups of eleven. Each group of eleven has a single master cell controlling that group. These twenty-two cells define one bit of a data storage structure, preferably two individually addressable register files. A desired number of these storage structures are grouped together to define a register file that is a desired number of bits wide. In accordance with another feature of the other embodiment, the two groups of flip-flops are accessible by two separate data paths of a processor operating in parallel.

The novel features which characterize the present invention are defined by the appended claims. The foregoing and other objects and advantages of the present invention will hereafter appear, and for purposes of illustration, but not of limitation, two preferred embodiments are shown in the accompanying drawings.

DESCRIPTION OF THE PREFERRED EMBODIMENTS

Figure 1:
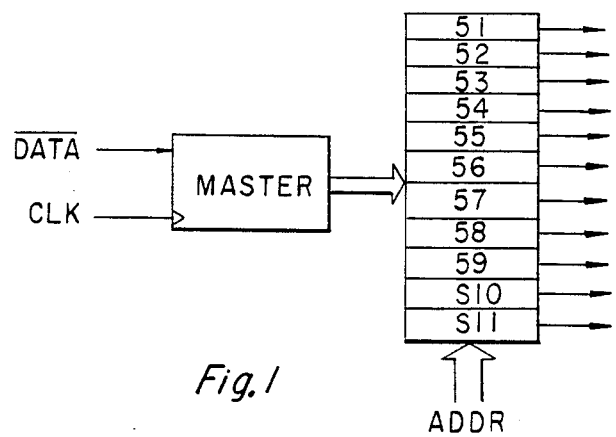
FIG. 1 shows a multi-slave master-slave flip-flop.

FIG. 1 is a functional block diagram of a multi-slave master-slave flip-flop (MSFF) showing a single master cell driving eleven slave cells (S1 through S11). The MASTER is clocked by a clock signal (CLK), and takes as data the signal $\overline{DATA}$. On each clock signal, the value of $\overline{DATA}$ is transferred by the MASTER to one of the eleven slave flip-flops. The slave flip-flop which receives the transferred data is addressed by the signal ADDR. Thus this MSFF acts as D-type flip-flop, although JK or T flip-flops could be used.

Figure 2:
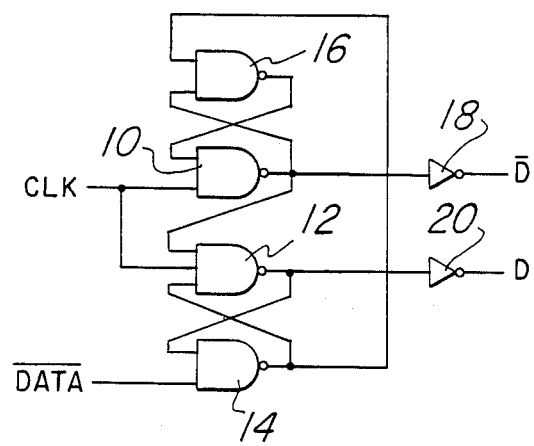
FIG. 2 is a logic diagram of the master flip-flop cell.

FIG. 2 shows a logic diagram of a preferred MASTER. When CLK is 0, the outputs of the two NAND gates 10, 12 are 1. When CLK is high the outputs of gates 10, 12 depend on $\overline{DATA}$. Tracing the signals to the various gates will convince one skilled in the art that, when CLK is high, the output of gate 12 has the same value as $\overline{DATA}$, while the output of gate 14 has the opposite state. The output of NAND gate 14 depends only on the value of $\overline{DATA}$. This effect occurs because the output of gate 12, which forms a cross-coupled latch with gate 14, is always either 1, or equal to $\overline{DATA}$. When $\overline{DATA}$ is 1, the output of gate 14 is 0, and when $\overline{DATA}$ is 0, the output of gate 14 is 1.

The output of NAND gate 16 will be the opposite state as gate 14. When the output of gate 14 is 0, the output of gate 16 must be 1. When the output of gate 14 is 1, the output of gate 16 depends on the value of gate 10 output. Since the output of gate 10 is always 1 when CLK is 0, the output of gate 16 will be 0. If the output of gate 14 changes from 0 to 1 while CLK is 0, the output of gate 16 will be latched at 0. If the output of gate 14 (driven by $\overline{DATA}$) changes from 0 to 1 while CLK is 1, the output of gate 16 will remain 1 until CLK returns to 0. When CLK returns to 0, the output of gate 10 goes to 1, and two logic-1 inputs drive the output of gate 16 to 0. While CLK is 1, the output of gate 10 will always be the complement of $\overline{DATA}$.

The outputs of the two inverters 18, 20 give the values $\overline{D}$ and D respectively when CLK is 1. When CLK is 0, the outputs of gates 18 and 20 are always 0.

Figure 3:
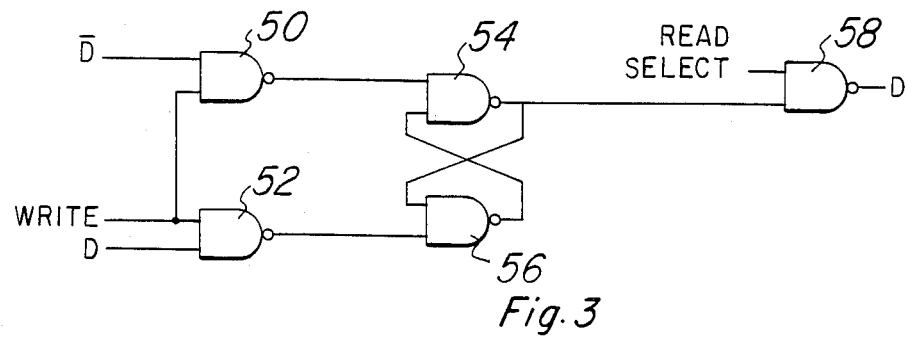
FIG. 3 is a logic diagram of a single slave cell.

Referring to FIG. 3, a preferred slave cell for use with the master cell of FIG. 2 is shown. The signals D and $\overline{D}$ are taken from the master cell of FIG. 2. The signals WRITE and READ SELECT are generated by addressing circuitry not yet shown, and are active when they are in a logical 1 state.

When WRITE is 0, the outputs of the two NAND gates 50, 52 are force to be 1. The outputs of the second two NAND gates 54, 56 will be of opposite state, so that, for example, the output of gate 56 will be 1 if the output of gate 54 if 0. As long as WRITE is low, the outputs of the cross-coupled NAND gates 54, 56 will not change.

When WRITE goes high, the values of $\overline{D}$ and D are transmitted to the crosscoupled NAND gates 54, 56 causing the outputs thereof to assume the value D for gate 54 and D for gate 56. When READ SELECT is high, the value from NAND gate 54 is inverted in gate 58, giving D as an output.

Figure 4:
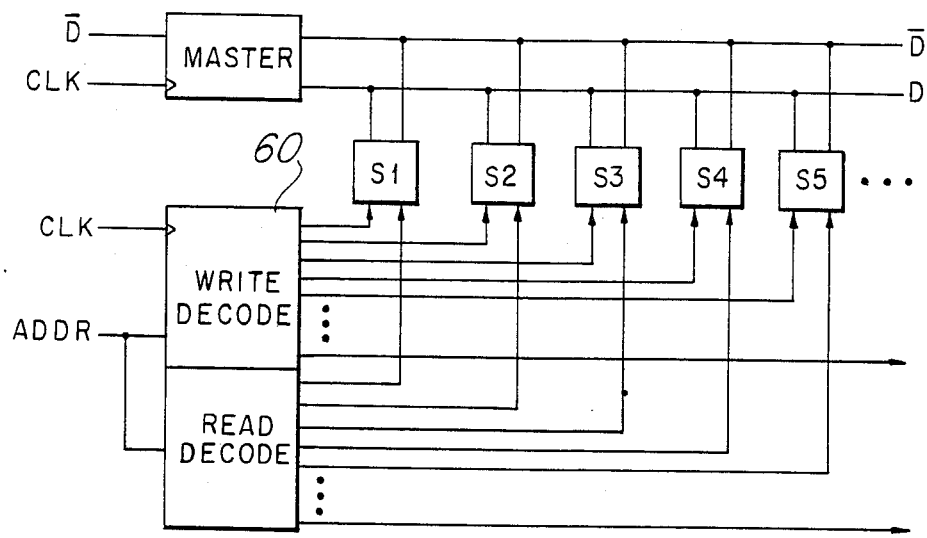
FIG. 4 is a block diagram of a multi-slave master-slave flip-flop.

Referring to FIG. 4, a master cell having a plurality of slaves is shown, $\overline{D}$ and CLK signals are input to the master, which outputs D and $\overline{D}$ signals as described above in connection with FIG. 2.

All slave cells (S1 thru S5, plus others not shown) are coupled to both the D and $\overline{D}$ outputs and operate as described in connection with FIG. 3. Each slave cell has two additional input lines. These are the WRITE and READ SELECT signals as described in connection with FIG. 3.

A decoder 60 drives the WRITE and READ SELECT lines into the slave cells. This decoder 60 can be logic circuitry of any design which provides these signals as described above. An example decoder, as shown in FIG. 4, is a simple binary to decimal decoder such as known in the art. It should have enough outputs to drive all of the slave cells with two lines each. The preferred implementation has the decoding circuitry for the read and write functions implemented separateky. The signal ADDR determines which slave cell is to be addressed. The reading and writing functions will have to be synchronized with the system elements they interact with to prevent glitches and other timing hazards as known in the art.

FIG. 4 illustrates the great surface area savings which can be realized with the MSFF. Only one master cell is needed for several slave cells. Decode circuitry would be needed, even if every slave had its own master, in order to select one of the master/slave combinations. Some kind of read/write indication would also be needed. Therefor, little or no extra chip space is required to generate the decode signals for the slave cells. The overall chip surface area savings are therefor substantial when a MSFF is used.

Figure 5:
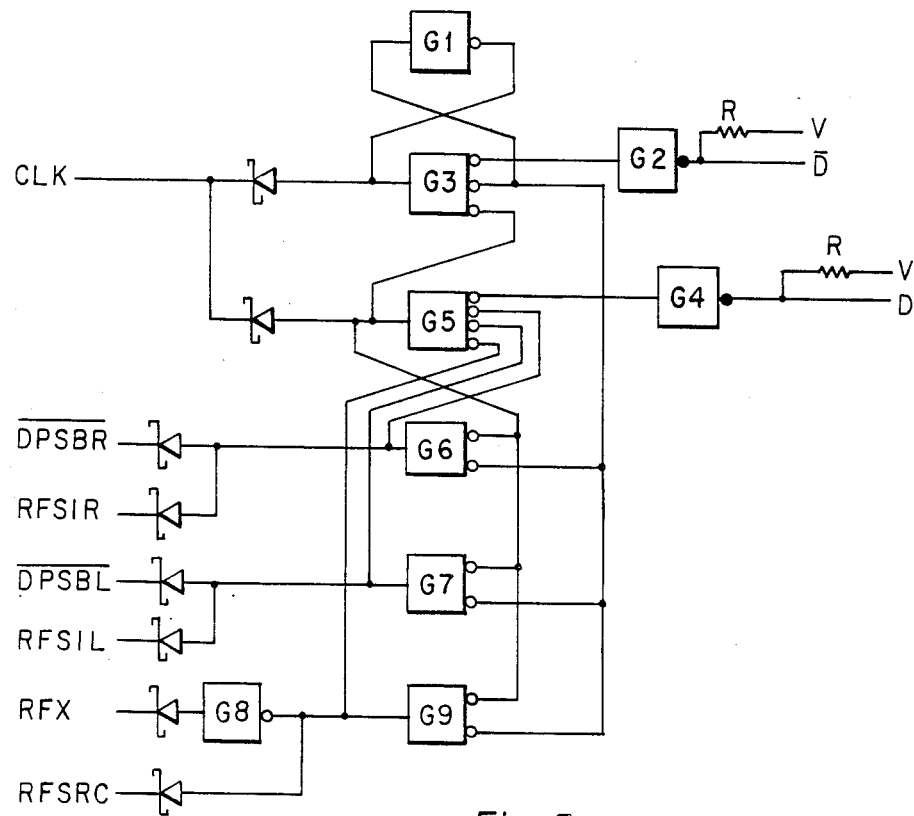
FIG. 5 is a schematic diagram of a master cell capable of being driven by two separate datapaths operating independently or in concert.

Referring to FIG. 5, a Schottky transistor logic (STL) implementation of a master cell is shown. Gates G1 through G9 are Schottky inverters, as known in the art, and a wired-AND results when two or more output lines are connected together.

Figure 6:
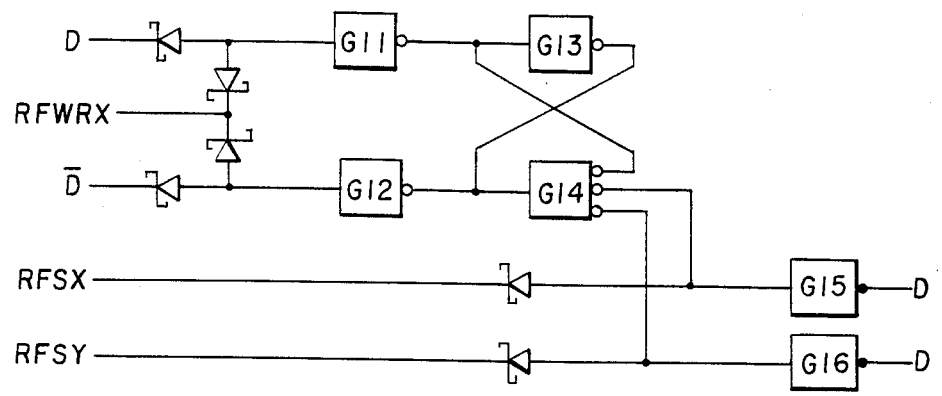
FIG. 6 is a schematic diagram of a single slave cell capable of being driven by two datapaths operating independently or in concert.

The gates G1 through G5 correspond to the upper three NAND gates 16, 10, 12 and inverters 18, 20 of FIG. 2. A hollow circle on the output of a gate, such as G1, indicates that gate is a standard Schottky inverter. The solid output circles on G2 and G4 indicate that the output diodes are elsewhere. In the case of G2 and G4, the output diodes are found close to the inputs of the following stage, and are shown in FIG. 6.

Gates G6, G7 and G9 all act in place of the lower NAND gate 14 of FIG. 2. G6 and G7 accept input signals $\overline{DPSBR}$ and $\overline{DPSBL}$ from first (right) and second (left) datapaths respectively and are selected by the appropriate control signals RFSIR, RFSIL. The use of two datapaths allows the master cell to operate in a dual-port mode as will be described in connection with FIG. 7.

In a high speed processing system, it is desirable that the clock signal to the master cell not be gated even if the master cell will not be used during a particular clock cycle. This int.roduces undesired noise and clock skew into the systek. Therefore,] in the preferred implementation shown in FIG. 5, it is desirable that the master cell always be clocked, and the addressed slave cell written to. In some designs, it is possible to design the decoder circuitry so that an invalid address can be entered and no slave cells will be accessed. However, another method to handle this situation is to recirculate the data from one of the slave cells back into the master when the master is not otherwise being used. This causes one of the slave cells to be rea from with the same value being written back into that slave cell. In the preferred implementation all read and write cycles are begun at the start of each cycle, when CLK is transitioning from 0 to 1. A slave cell's data is read and operated on in one CLK cycle and written back at the start of the next CLK cycle. Because of this slave cell synchronization of the WRITE and READ SELECT signals, a READ and a WRITE can be achieved during each CLK cycle, improving system performance.

G8 and G9 implement the recirculate mechanism described above. The signal RFX is the data from the selected slave cell which has just been rad and which will be written back into. The method of obtaining the signal RFX will be discussed in connection with FIG. 7. RFSRC us a control signal selecting the recirculate mode.

Referring to FIG. 6, a preferred STL implementation of a single slave cell is shown. The gate notation in this Figure is the same as in FIG. 5. G11 and G12 correspond to the WRITE enable NAND gates 50, 52 of FIG. 3, and G13 and G14 correspond to the gates 54, 56 of the latch of FIG. 3. The Schottky diodes on the D and $\overline{D}$ inputs are those associated with gates G2 and G4 of FIG. 5. Note that the polarity of the D and $\overline{D}$ signals have been reversed as compared with FIG. 3. G15 and G16 implement two different READ SELECT signals RFSX and RFSY which correspond to the NAND gate 58 of FIG. 3. This implementation consists of a multiport register file with RFSX selecting the the slave cells to be read from port-x. RFSY selects slaves to be read from port-y.

Figure 7:
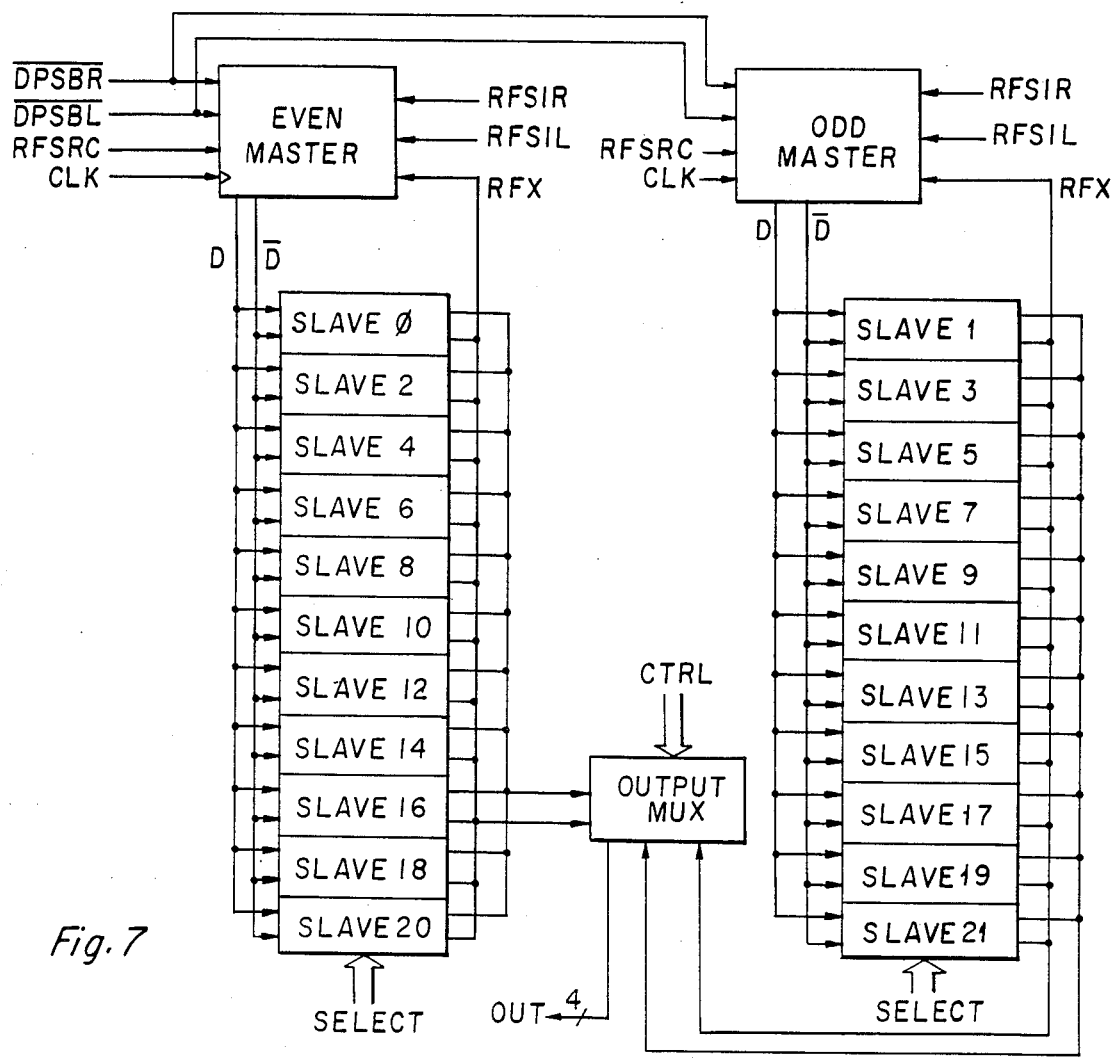
FIG. 7 is a block diagram of a one bit wide dual multi-slave master-slave flipflop array capable of being driven by separate datapaths operating independently or in concert.

Referring to FIG. 7, a block diagram is shown of a one-bit slice of an n-bit dual port register file, where n is preferably 8, 16 or 32, suitable for implementation on a single integrated circuit chip. The dual port register file is suitable for use with a single processor having two data paths, two processors operating in parallel, or any other application which requires a dual port file.

The one-bit slice of the register file includes twin master cells referred to as the EVEN MASTER and the ODD MASTER, with each master having eleven slave cells. The pictured circuit also includes an output multiplexer (OUTPUT MUX) which determines which datapath receives the output from which slave cell. The output lines from the even and odd masters are the D and $\overline{D}$ signals described above. Each slave cell has two output lines as described in connection with FIG. 6. All of the correspondingoutputs of the slave cells in each group are wire-ANDed together. One of these output lines is recirculated back to the appropriate MASTER cell in order to act as the recirculate signal RFX as described in connection with FIG. 5. The address decode circuitry for the slave cells is not shown in FIG. 7, so that the address lines for the slave cells are shown as the signals SELECTE and SELECTO, which address the even and odd groups of slave cells respectively. SELECTE and SELECTO contain all of the RFWRS, RFSX and RFSY signals for the corresponding slave cells. Since each slave cell has one WRITE signal and two READ SELECT signals, SELECTE and SELECTO together require sixty-six input lines for the twenty-two slave cells shown.

The OUTPUT MUX has four output lines, with two going to each of the datapaths (left and right). Each datapath can have access to one bit from each group of slave cell, in working with single precision words, or the odd and even slaves can be operated on in concert as double precision words. The OUTPUT MUX is a standard implementation of logic to implement this function. The signal CTRL is a multiple bit control signal for selecting which selected slave cell (odd or even) goes to which datapath (left or right). This implements the dual port function described above. The details of which signals make up CTRL will depend on the system which uses this device. OUT is a four bit signal, two of which go to each datapath bus (left or right).

The circuit as shown in FIG. 7 acts as a single bit of a twenty-two deep register file which can be dynamically reconfigured as a double precision eleven-deep register file. Typicaly, a computer system will have 8, 16 or 32 bits for a word width. I such case, an appropriate number of circuits having the design of FIG. 7 would be used in parallel.

Various modifications can be made to the preferred embodimets described above. For example, NOR gates could be used instead of NAND gates to implement the logic. Also, negative logic could be used instead of the positive logic described, and the number of slaves attached to each master can be varied as needed. Additional master-slave groups could be added to FIG. 7 to give a memory having more than two ports.

TECHNICAL ADVANTAGES

The MSFF as described above provides a significant savings in space on an integrated circuit chip while providing the full benefits of the use of master-slave flipflops in computer systems. When the MSFF is implemented in schottky-transistor logic, a high performance computer system register file capable of simulaneously handling two parallel datapaths, or alternatively providing double word width values for double precision operation, is easily made.

The present invention has been illustrated by the circuitry described above, and it will become apparent to those skilled in the art that various modifications and alternations may be made thereto. Such variations fall within the spirt of the present invention, the scope of which is defined by the appended claims.

What is claimed is:

1. A multiple slave master-slave flip-flop, comprising:
    a flip-flop master cell having a data input and a clock input;
    a plurality of single-bit flip-flop slave cells connected in parallel and each coupled to said master cell;
    each of said slave cells including address input means;
    each of said slave cells being responsive to a write signal, a predetermined address on said address input means and both a data input and clock input at said flip-flop master to store said data therein;
    each of said slave cells being responsive to a read signal and said predetermined address on said address input means to read out therefrom data stored therein 2. A data storage circuit for a computer system, comprising:
    a master flip-flop cell having a data and a clock input and having a data and an inverted data output; and
    a plurality of slave flip-flop cells, each slave cell having a data and an inverted data input coupled respectively to the master flip-flop data and inverted data outputs, all of said slave flip-flop cells being connected in parallel, a write enable input, at least one read enable input and at least one data output responsive to said data inputs thereto, said write enable input and said at least one read enable input.

3. The data storage circuit of claim 2, further comprising decode circuitry for separately addressing each of said slave cells through the write enable and the read enable inputs.

4. a data storage device for a computer system, comprising:
    first and second master cells, each master cell having at least two data inputs selectively coupled thereto, a clock input, and a data and an inverted data output;
    a first and second plurality of slave cells coupled to said first and second master cells respectively, each slave cell having a data and an inverted data input coupled to the data and inverted data output of a predetermined one of said first and second master cells, a write enable input, a read enable input and at least two data outputs responsive to said data inputs thereto, said read enable input; and
    an output multiplexer having a control input and an output line and responsive to the data outputs of said first and second plurality of slave cells to send the output of a selected slave cell from each of the first and second plurality of slave cells to said output line.

* * * * *